(12) United States Patent
Takayanagi

(10) Patent No.: US 12,362,743 B2
(45) Date of Patent: Jul. 15, 2025

(54) SEMICONDUCTOR DEVICE

(71) Applicant: Renesas Electronics Corporation, Tokyo (JP)

(72) Inventor: Koji Takayanagi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 50 days.

(21) Appl. No.: 18/331,381

(22) Filed: Jun. 8, 2023

(65) Prior Publication Data

US 2023/0412169 A1    Dec. 21, 2023

(30) Foreign Application Priority Data

Jun. 20, 2022    (JP) .................... 2022-098712

(51) Int. Cl.
*H03K 17/56* (2006.01)
(52) U.S. Cl.
CPC .................... *H03K 17/56* (2013.01)
(58) Field of Classification Search
CPC .... H03K 17/56; H03K 17/162; H03K 17/165; H03K 2217/0063; H03K 2217/0072; H03K 17/102; H03K 17/08104; H03K 19/018507; H03K 19/018521; H03K 19/00315
See application file for complete search history.

(56) References Cited

U.S. PATENT DOCUMENTS 9,948,283 B2    4/2018  Takayanagi
11,595,042 B1*  2/2023  Chen .................. H03K 17/6872

FOREIGN PATENT DOCUMENTS

JP          2017175288 A     9/2017

\* cited by examiner

*Primary Examiner* — Metasebia T Retebo
(74) *Attorney, Agent, or Firm* — SCULLY, SCOTT, MURPHY & PRESSER, P.C.

(57) ABSTRACT

A first P-type transistor and a second P-type transistor are connected in series between a power supply terminal and an output terminal. A first N-type transistor and a second N-type transistor are connected between a ground terminal and a power supply terminal. The second N-type transistor and the second P-type transistor are complementarily turned on and off in accordance with an input signal. A gate voltage control circuit changes at least one of the gate voltage of the P-type transistor whose drain is electrically connected to the output terminal and the gate voltage of the N-type transistor by following the output voltage VOUT of the output terminal while keeping the P-type transistor or the N-type transistor on-states.

13 Claims, 10 Drawing Sheets

SEMICONDUCTOR DEVICE

CROSS-REFERENCE TO RELATED APPLICATION

The present application claims priority from Japanese Patent Application No. 2022-098712 filed on Jun. 20, 2022, the content of which is hereby incorporated by reference to this application.

BACKGROUND

The present disclosure relates to a semiconductor device, in particular, a semiconductor device for outputting a signal that has a higher voltage amplitude than that of a transistor.

In a semiconductor device including a level shift circuit, known by using a low-amplitude logic signal as an input has been an example in which a circuit for outputting a high-amplitude logical signal is configured by using a transistor that has a withstand voltage corresponding to a low amplitude. For example, known has been an example in which a semiconductor device is configured by a transistor having a withstand voltage of 1.8 [V], the semiconductor device generating an output signal set to 0 [V] (GND) or 3.3 [V] in response to an input signal set to 0 [V] (GND) or 1.8 [V].

In Japanese Patent Application Laid-Open No. 2017-175288 (Patent Document 1), shown is a circuit configuration which secures a withstand voltage by connecting two low withstand voltage transistors in series to respective regions between a high voltage power supply terminal and an output terminal generating an output signal and between the output terminal and a ground terminal in an output stage. Further, in Patent Document 1, a turn-on voltage is supplied via a potential conversion circuit to a gate of a low withstand voltage transistor that constitutes the output stage. Consequently, a gate-source voltage applied when the low withstand voltage transistor is turned on can be kept low.

SUMMARY

In the semiconductor device disclosed in Patent Document 1, hot carrier deterioration can be suppressed by suppressing a transient drain-source voltage when the low-voltage transistor is turned on.

However, in the technique of Patent Document 1, by keeping a voltage between a gate and a source low, an operation speed at the time of turn-on of the transistor decreases. That is, it is understood that there is a trade-off relationship between suppression of the hot carrier deterioration and improvement of the operation speed.

For this reason, when the technique of Patent Document 1 is applied to a semiconductor device manufactured by an advanced process in which the hot carrier deterioration is large and if a gate voltage is adjusted so as to be able to suppress the hot carrier deterioration, a decrease in the operation speed of the transistor becomes conspicuous, so that there is concern that a problem may arise in application to circuits that require high-speed responsiveness.

The present disclosure is intended to solve the above problem and provides a semiconductor device capable of suppressing the hot carrier deterioration without lowering the operation speed in generating an output voltage with a voltage amplitude higher than the withstand voltage of the transistor.

Other problems and novel features will become apparent from the description of the present specification and the accompanying drawings.

A semiconductor device according to one embodiment, which generates an output signal at an output terminal, the output signal having a larger voltage amplitude than an input signal, includes: a first second P-type transistor, a second P-type transistor, a first N-type transistor, a second N-type transistor, and a gate voltage control circuit. The first second P-type transistor and the second P-type transistor are connected in series between a power supply line supplying a first power supply potential and an output terminal generating an output signal. The first N-type transistor and the second N-type transistor are connected in series between a reference potential line supplying a reference potential and the output terminal. The first N-type transistor and the P-type transistor have drains electrically connected to the output terminal. Signals for complementarily turning on and off the second N-type transistor and the second P-type transistor are inputted to gates of the second N-type transistor and the P-type transistor according to the input signal, respectively. The gate voltage control circuit changes gate voltages of the first P-type transistor and the first N-type transistor in accordance with a voltage of the output terminal. The gate voltage control circuit is configured to: cause the first P-type transistor or the N-type transistor to follow a change in a voltage of the output terminal while keeping the first P-type transistor or the N-type transistor on-states when a voltage of the output signal changes in accordance with a change in a logic level of the input signal; and change a gate voltage of at least one of one of the first N-type and P-type transistors.

According to the above embodiment, in the semiconductor device that generates the output voltage with the voltage amplitude higher than the withstand voltage of the transistor, the hot carrier deterioration can be suppressed without lowering the operation speed.

DETAILED DESCRIPTION

Figure 1:
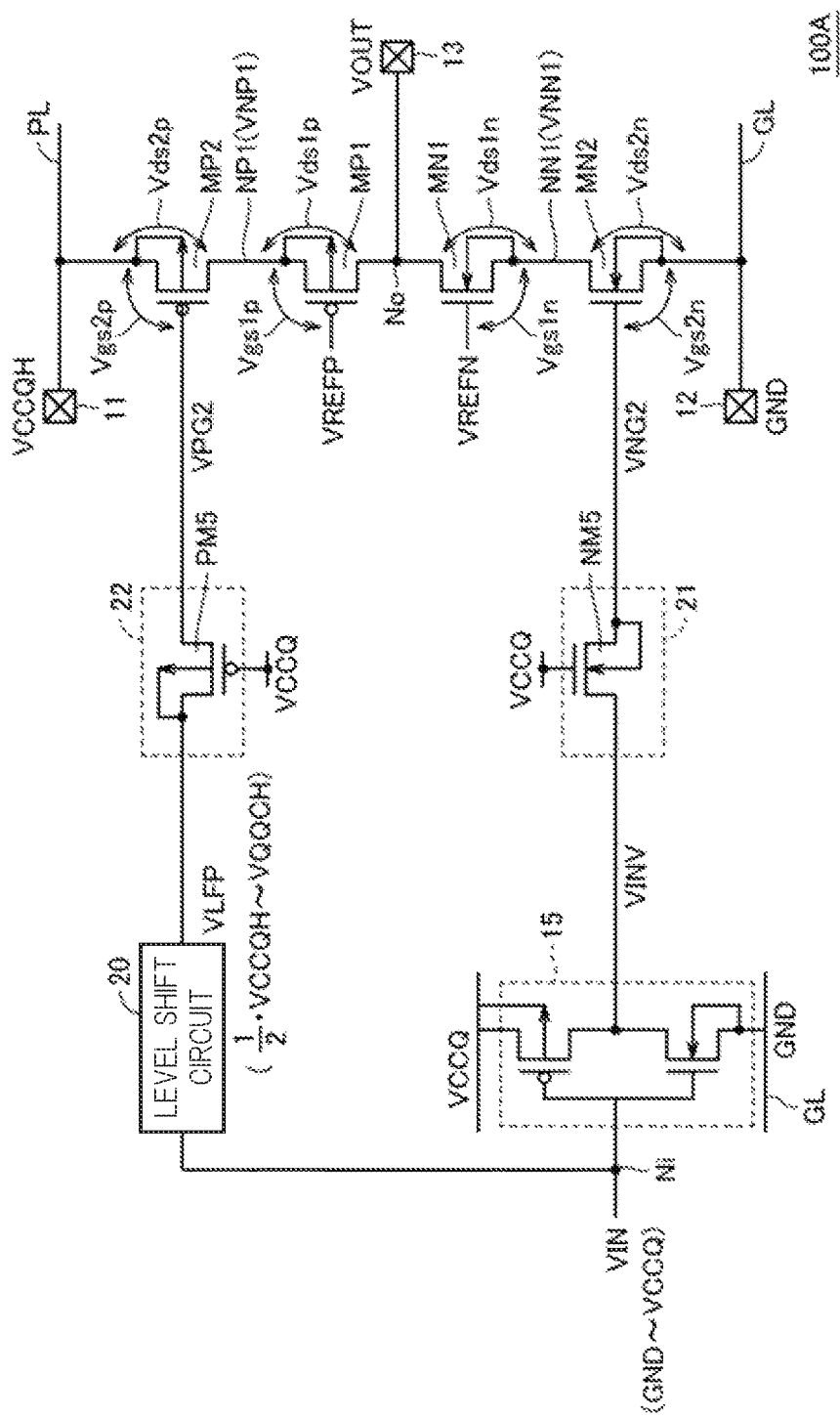
FIG. 1 is a circuit diagram for explaining a configuration of a semiconductor device according to a first comparative example.

Hereinafter, each embodiment will be described in detail with reference to the drawings. Incidentally, the same or corresponding parts are denoted by the same reference numerals, and a description thereof will not be repeated.

<Explanation of Comparative Example>

FIG. 1 is a circuit diagram for explaining a configuration of a semiconductor device 100A according to a first comparative example.

With reference to FIG. 1, a semiconductor device 100A according to a first comparative example outputs, to an output terminal 13, an output signal having a logic level corresponding to an input signal VIN of an input node N1. The input signal VIN is a binary signal, the binary signal being set to a ground potential GND, which is a reference potential, at a logic low level (hereinafter "L level"), while being set to a low power supply potential VCCQ at a logic high level (hereinafter "H level").

Meanwhile, the output signal is set to the ground potential GND at the L level, and is set to a high power supply potential VCCQH higher than the low power supply potential VCCQ of 33 at the H level. That is, an amplitude of the output signal is greater than an amplitude of the input signal VIN. As one example, the low power supply potential VCCQ is 1.8 [V] and the high power supply potential VCCQH is 3.3 [V].

Incidentally, a voltage value of the output terminal 13 is hereinafter referred to as an output voltage VOUT. Therefore, when the output signal is a H level, VOUT=VCCQH (3.3 [V]), and when the output signal is an L level, VOUT=GND (0 [V]). Alternatively, when the output signal changes from the H level to the L level or from the L level to the H level, the output voltage VOUT transiently changes between the ground potential GND (0 [V]) and the high power supply potential VCCQH (3.3 [V]).

The semiconductor device 100A has the same configuration as that of Patent Document 1, and includes an inverter 15, a level shift circuit 20, potential conversion circuits 21, 22, P-type transistors MP1, MP2 and N-type transistors MP1, MP2 which form an output stage. The transistors MP1, MP2, MN1, MN2 have withstand voltages equivalent to the low power supply potential VCCQ (here, 1.8 [V]). That is, the withstand voltages of the transistors MP1, MP2, MN1, MN2 are lower than a potential difference between the high power supply potential VCCQH and the ground potential GND.

The inverter 15 receives the low power supply potential VCCQ and operates to output an inverter output signal VINV obtained by inverting the input signal VIN. VINV=VCCQ when the input signal VIN is at a logic low level (hereinafter "L level"), and VINV=GND when the input signal VIN is at a logic high level (hereinafter "H level").

The level shift circuit 20 outputs a level shift signal VLFP obtained by inverting the input signal VIN. The level shift circuit 20 is set at VLFP=VCCQH when the input signal VIN is at an L level, and is set at VLFP=(1/2)·VCCQH when the input signal VIN is at a H level.

The potential conversion circuit 21 outputs a gate voltage signal VNG2, which is obtained by converting a potential of the inverter output signal VINV from the inverter to a gate of the transistor MN2. The potential conversion circuit 21 has an N-type transistor MN5 whose gate the low power supply potential VCCQ is inputted to and which functions as an NMOS transfer gate. While an amplitude of an inverter output signal VINV is GND to VCCQ, an amplitude of a gate voltage signal VNG2 outputted from the potential conversion circuit 21 is GVD to VCCQ-Vtn. Here, Vtn is a threshold voltage of the transistor MN5.

Similarly, the potential conversion circuit 22 outputs a gate voltage signal VPG2, which is obtained by converting a potential of the level shift signal VLFP from the level shift circuit 20, to a gate of the transistor MP2. The potential conversion circuit 22 has a P-type transistor MP5 whose gate the low power supply potential VCCQ is inputted to and which functions as a PMOS transfer gate. While an amplitude on a transient state of the level shift signal VLFP is (1/2)·VCCQH to VCCQH, an amplitude of a gate voltage signal VPG2 outputted from the potential conversion circuit 22 is (1/2)·VCCQH+Vtp to VCCQH. Here, Vtp is a threshold voltage of the transistor MP5.

In the output stage, the P-type transistors MP1, MP2 are connected in series between an output node No connected to the output terminal 13 and a power supply line PL connected to the power supply terminal 11 via a node NP1. That is, a source of the transistor MP2 is connected to the power supply line PL, and a drain thereof is connected to the node NP1. The source of the transistor MP1 is connected to the node NP1, and the drain thereof is connected to the output node No.

Similarly, the N-type transistors MN1, MN2 are connected in series between the output node No and the ground line GL connected to the ground terminal 12 via the node NN1. That is, the transistor MN2 has a source connected to the ground line GL and a drain connected to the node NN1. The source of transistor MN1 is connected to the node NN1, and the drain thereof is connected to the output node No.

A bias voltage VREFP is inputted to the gate of the transistor MP1, and a bias voltage VREFN is inputted to the gate of the transistor MN1. The bias voltages VREFP, VREFN are set to an intermediate potential between the ground potential GND and the high power supply potential VCCQH that can turn on the transistors MP1, MN1. For example, they are set to VREFN=VCCQ and VREFP=(1/2)·VCCQH.

A gate voltage signal VPG2 from the potential conversion circuit 21 is inputted to the gate of the transistor MP2. A gate voltage signal VNG2 from the potential conversion circuit 22 is inputted to the gate of the transistor MN2.

When the input signal VIN is at the L level (GND), the inverter 15 outputs a H level (VINV=VCCVQ) and the level shift circuit 20 outputs a H level (VLFP=VCCQH). Therefore, VPG2=VCCQH is inputted to the gate of the transistor MP2, and VNG2=VCCQ-Vtn is inputted to the gate of the transistor MN2. As a result, the transistor MP2 is turned off while the transistor MN2 is turned on, so that the ground potential GND is transmitted to the output node No and the output signal becomes an L level (VOUT=GND).

Conversely, when the input signal VIN is at the H level (VCCQ), the inverter 15 outputs an L level (VINV=GND) and the level shift circuit 20 outputs an L level (VLFP=(1/2)·VCCQH). Therefore, VPG2=(1/2)·VCCQH+Vtp is inputted to the gate of the transistor MP2, and VNG2=GND is inputted to the gate of the transistor MN2. As a result, the transistor MN2 is turned off while the transistor MP2 is turned on, so that the high power supply potential VCCQH is transmitted to the output node No and the output signal becomes a H level (VOUT=VCCQH).

Thus, the semiconductor device 100A can use a logic signal (input signal VIN) of the low amplitude (GND to VCCQ) as an input and can output a logic signal (output voltage VOUT) of the high amplitude (GND to VCCQH).

Figure 2:
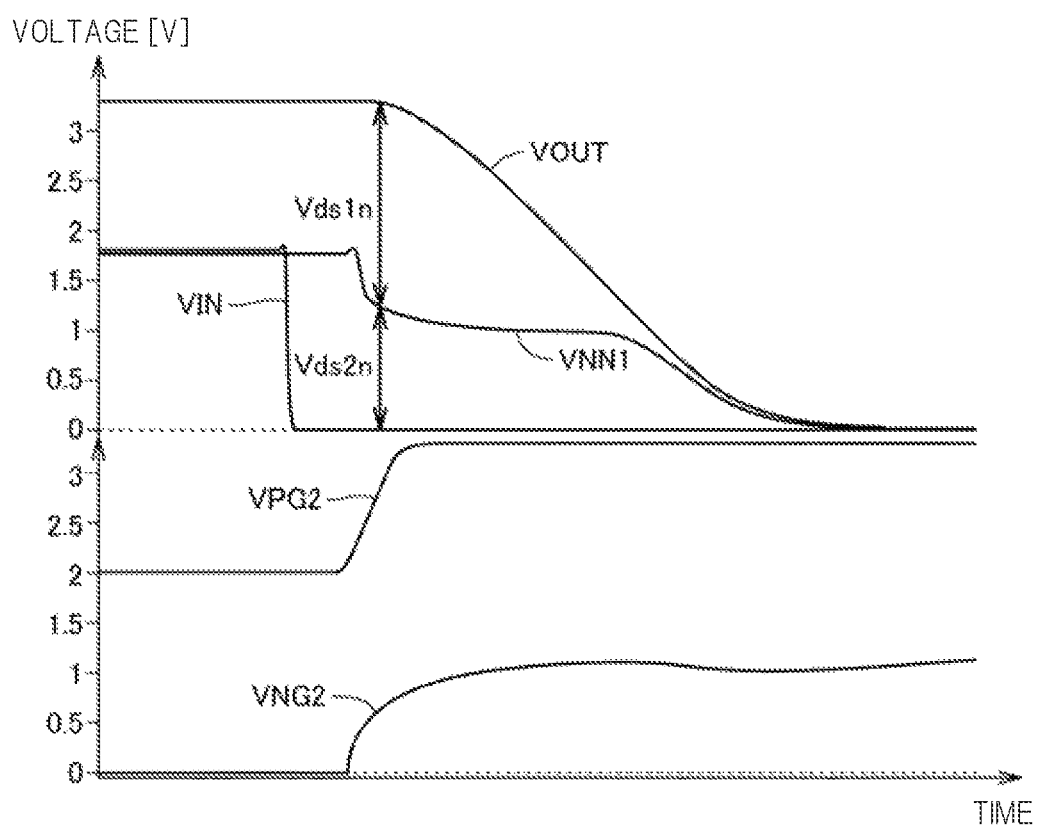
FIG. 2 is a transient operation waveform diagram of the semiconductor device shown in FIG. 1.

FIG. 2 shows a transient operation waveform diagram of the semiconductor device 100A shown in FIG. 1, specifically, a transient operation waveform diagram when the input signal VIN changes from a H level to an L level.

With reference to FIG. 2, when the input signal VIN changes from a H level (VCCQ=1.8 [V]) to an L level (GND=0 [V]), the gate voltage signal VPG2 changes to an L level ((1/2)·VCCQH+Vtp≈2.0 [V]) to a H level (VCCQH=3.3 [V]) as described above. Alternatively, the gate voltage signal VNG2 rises from an L level (GND=0 [V]) to a H level (VCCQ−Vtn≈1.0 [V]).

In response to changes in the gate voltage signals VNG2, VPG2, in the output stage, the transistor MP2 is turned off while the transistor MN2 is turned on. Accordingly to this, the output voltage VOUT of the output terminal 13 changes from a H level (VCCQH=3.3 [V]) to an L level (GND=0 [V]).

When the output voltage VOUT drops, there is concern that drain-source voltages Vds1n, Vds2n of the transistors MN1, MN2 that are turned on may increase transiently. The potential VNN1 of the node NN1 corresponding to the connection nodes of the transistors MN1, MN2 is equivalent to a bias voltage VREFN inputted to the gate of the transistor MN1 while the output signal is at the H level (VOUT=VCCQH). When VREFN=VCCQ=1.8 [V], Vds1n is about VCCQH−VCCQ=1.5 [V] in the transistor MN1 and Vds1n is about VREFN=1.8 [V] in the transistor MN1. At this time, both Vds1n and Vds2n are equal to or lower than a withstand voltage level (1.8 [V]) of the transistors MN1, MN2.

In contrast, as shown in FIG. 2, in a process in which the gate voltage signal VNG2 rises, the potential VNN1 of the node NN1 drops prior to the output voltage VOUT, so that the Vds1n of the transistor MN1 transiently is greater. In the semiconductor device 100A, the gate voltage signal VNG2 of the transistor MN2 is generated by the potential conversion circuit 21, which suppresses a transient amount of increase in the Vds1n of the transistor MN1.

Figure 3:
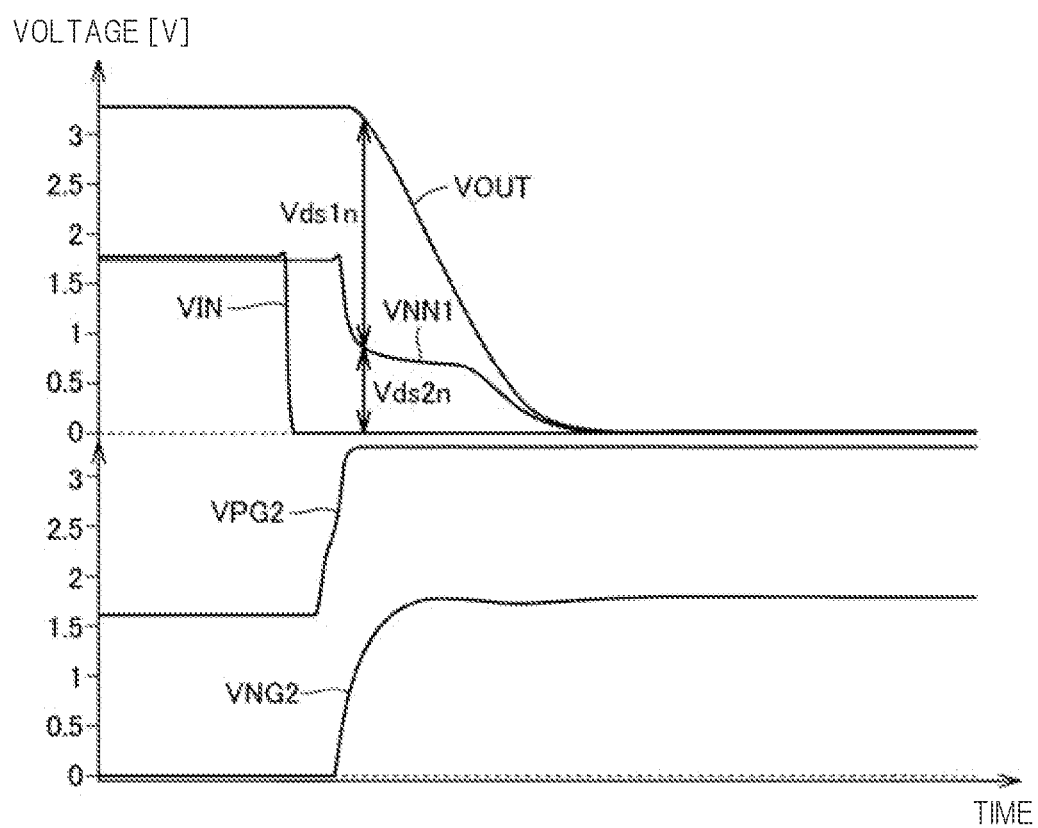
FIG. 3 is a transient operation waveform diagram of a modification example of the semiconductor device shown in FIG. 1.

FIG. 3 shows an operation waveform diagram similar to that of FIG. 2 where arrangement of the potential conversion circuits 21, 22 is omitted from the semiconductor device 100A.

As shown in FIG. 3, when the potential conversion circuits 21, 22 are not arranged, the gate voltage signal VPG2 rises from 1.8 [V] (L level: (1/2)·VCCQH) to 3.3 [V] (H level: VCCQH) at a higher speed than that in FIG. 2. Similarly, the gate voltage signal VNG2 rises from 0 [V] (L level: GND) to 1.8 [V] (H level: VCCQ) at a higher speed than that in FIG. 2.

In response to this, in FIG. 3, a turn-on operation of the transistor MN2 is faster, so that an amount of decrease in the potential VNN1 of the node NN1 is greater than that in FIG. 2. As a result, in FIG. 3, compared to FIG. 2, the Vds1n of the transistor MN1 transiently becomes excessive, exceeding a withstand voltage level (1.8 [V]) and rising to about 2.5 [V]. As a result, there is concern about the hot carrier deterioration in the transistor MN1.

In other words, in the semiconductor device 100A according to the first comparative example, by providing the potential conversion circuits 21, 22, lowering of the gate-source voltage of the transistor MN1 (Vga2n in FIG. 1) at the turn-on can moderate a change in the potential VNN1 of the node NN1. Consequently, the transient Vds1n of the transistor MN1 is lowered as compared with that in FIG. 3 and, as a result, the hot carrier deterioration can be suppressed.

Meanwhile, as can be understood from the comparison between FIGS. 3 and 2, as a result of suppressing the gate-source voltage, the turn-on speed of the transistor decreases, so that a time required for level transition of the output voltage VOUT (in FIGS. 2 and 3, H level to L level) is increased in FIG. 2. That is, it is understood that the operation speed of the semiconductor device 100A is reduced in exchange for suppressing the hot carrier deterioration.

Figure 4:
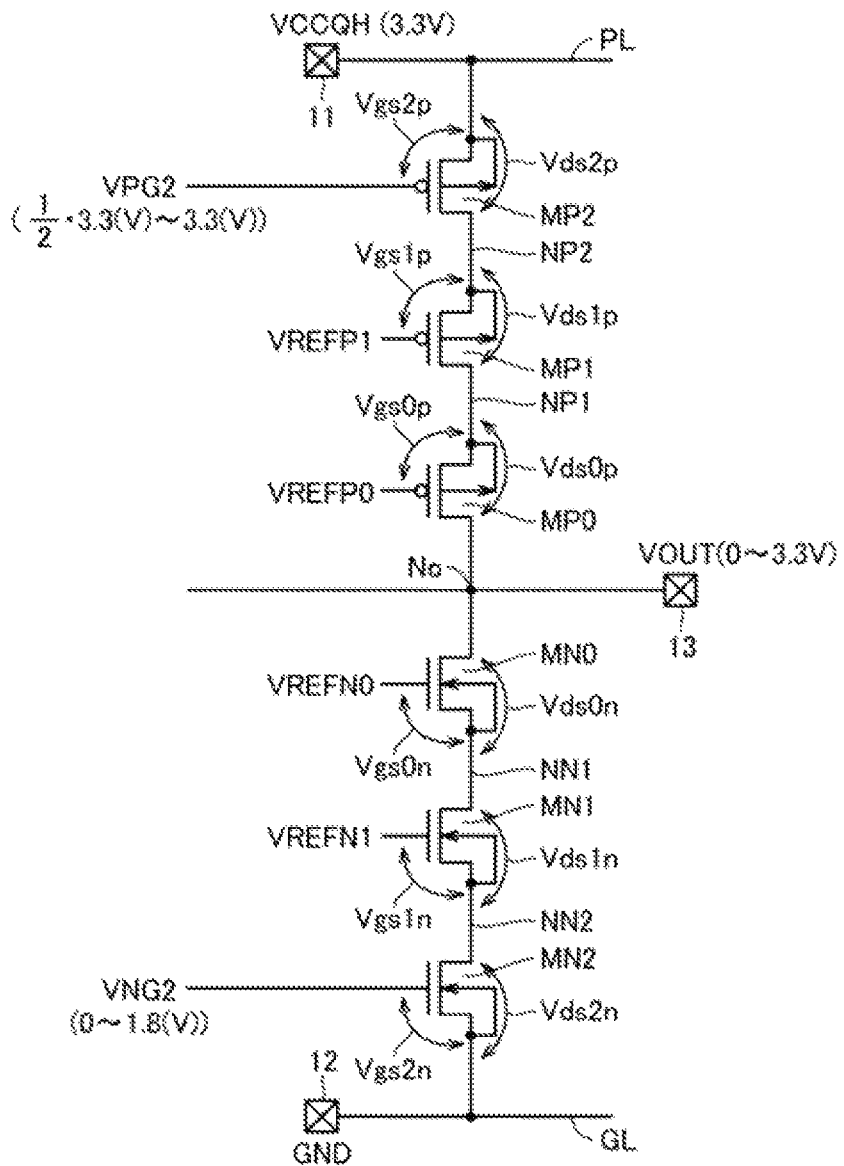
FIG. 4 is a circuit diagram for explaining a configuration of a semiconductor device according to a second comparative example.

FIG. 4 shows a circuit diagram for explaining a configuration of a semiconductor device according to a second comparative example. In FIG. 2, in order to avoid a decrease in operation speed, the potential conversion circuits 21, 22 in FIG. 2 are not arranged and, by increasing the number of transistors connected in series on an output stage, a decrease in a drain-source voltage per transistor is intended.

Referring to FIG. 4, a semiconductor device 100B according to a second comparative example includes P-type MP0 to MP2 terminals and N-type transistors MN0 to MN2 that form an output stage. In FIG. 4 as well, it is assumed that the low power supply potential VCCQ and the high power supply potential VCCQH are at the same level as in FIG. 2. The withstand voltage of each of the transistors MN0 to MN2 and MP0 to MP2 constituting the output stage is equivalent to the low power supply potential VCCQ (1.8 [V]) as described above, and is lower than a potential difference between the high power supply potential VCCQH and the ground potential GND.

The P-type transistors MP0 to MP2 are connected in series via the nodes NP1, NP2 between the output node No and a power supply line PL. Specifically, the transistor MP0 has a drain connected to the output node No (output terminal 13) and a source connected to the node NP1. The transistor MP1 has a source connected to a node NP2, and a drain connected to a node NP1. Alternatively, the transistor MP2 has a source connected to the power supply line PL, and a drain connected to the node NP2.

The N-type transistors MN0 to MN2 are connected in series via the nodes NN1, NN2 between the output node No and the ground line GL. Specifically, the transistor MN0 has a drain connected to the output node No and a source connected to the node NN1. The transistor MN1 has a drain connected to the node NN1 and a source connected to the node NN2. Alternatively, the transistor MP2 has a source connected to the ground line GL, and a drain connected to the node NN2.

A fixed bias voltage VREFP0 is inputted to a gate of the transistor MP0, and a fixed bias voltage VREFP1 is inputted to a gate of the transistor MP1. For example, it is set to VREFP0=VREFP1=0.5·VCCQH. The output signal (VLFP) of the level shift circuit 20 in FIG. 1 is inputted to the gate of the transistor MP2 without going through the potential conversion circuit 22 (FIG. 1). That is, the gate voltage signal VPG2 of the transistor MP2 has an amplitude of (1/2)·VCCQH to VCCQH, that is, an amplitude of (1/2)·3.3 [V] to 3.3 [V].

A fixed bias voltage VREFN0 is inputted to the gate of the transistor MN0, and a fixed bias voltage VREFN1 is inputted to the gate of the transistor MN1. For example, it is set to VREFN0=VREFN1=VCCQ. The output signal (VINV) of the inverter 15 in FIG. 1 is inputted to the gate of the transistor MN2 without going through the potential conversion circuit 21 (FIG. 1). That is, the gate voltage signal VNG2 of the transistor MN2 has an amplitude of GND to VCCQ, that is, an amplitude of 0 [V] to 1.8 [V].

In the semiconductor device 100B, considered will be operations of the transistors MN0 to MN2 when the output voltage VOUT falls from 3.3 [V] to 0 [V] (VCCQH) by changing the gate voltage signal VNG2 from 0 [V] to 1.8 [V] (low power supply potential VCCQ) in accordance with the logic level change of the input signal VIN.

First, consider a first case where VREFN0=VREFN1, for example, both are 1.8 [V]. In the first case, when the output voltage VOUT changes from the H level to the L level in accordance with the rise of the output voltage (VNG2) of the inverter 15, the transistors MN2 and the transistor MN1 are turned on in that order. Consequently, the drain-source voltage Vds0n of the transistor MN0 on an output terminal 13 side increases due to the potential drop of the node NN1, so that the hot carrier deterioration of the transistor MN0 increases.

Next, consider a second case where VREFN0>VREFN1, for example, VREFN0=2.2 [V] and VREFN1=1.8 [V]. In the second case, by increasing the gate-source voltage Vgs0n of the transistor MN0 whose gate VREFN0 is inputted to, the potential of the node NN1 becomes higher than that in the above-described first case. Consequently, the drain-source voltage Vds0n of the transistor MN0, that is, the hot carrier deterioration is suppressed more than that in the first case. However, in the second case, when the output voltage VOUT of the output terminal 13 drops to 0 [V], an overvoltage of 2.2 [V] may be applied between the drain and the gate of the transistor MN0 with a withstand voltage of 1.8 [V]. Conversely, in the first case, the gate voltage (VREFN0) of the transistor MN0 is set so that an overvoltage is not applied between the drain and the source of the transistor MN0 even if the output voltage VOUT drops to 0 [V].

As described above, in the semiconductor device 100B according to the second comparative example, the inventor (s) has found, as new problems, that the gate voltage of the transistors MN0, NP0 whose drains are connected to the output terminal 13 does not exceed the withstand voltage and that gate voltage setting for suppressing the hot carrier deterioration is required.

First Embodiment

Figure 5:
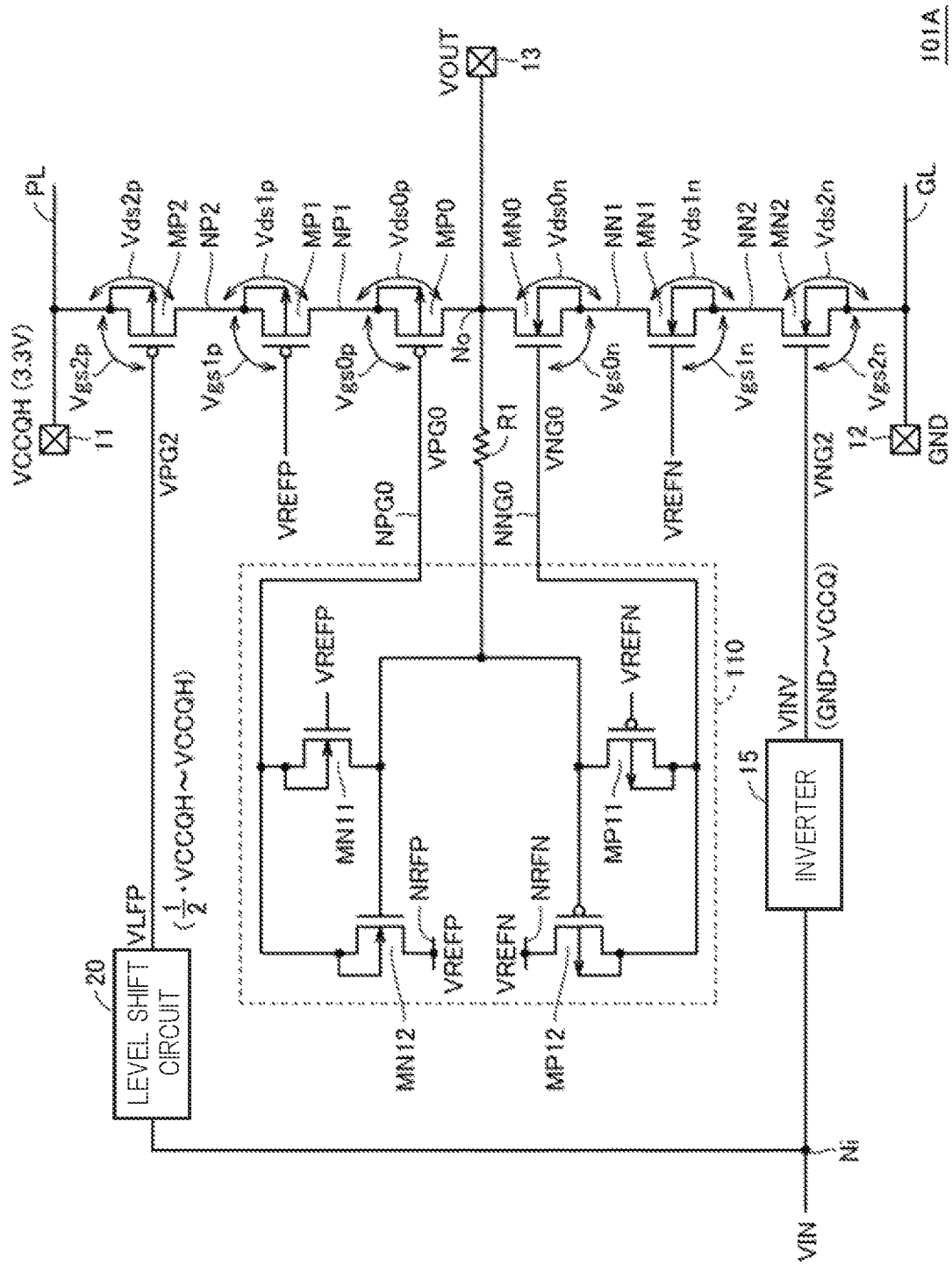
FIG. 5 is a circuit diagram for explaining a configuration of a semiconductor device according to a first embodiment.

FIG. 5 is a circuit diagram for explaining a configuration of a semiconductor device 101A according to a first embodiment.

As shown in FIG. 5, a semiconductor device 101A includes a level shift circuit 20, a gate voltage control circuit 110, N-type transistors MN0 to MN2 and P-type transistors MP0 to MP2.

The transistors MN0 to MN2 and MP0 to MP2 constitute an output stage similar to that of the semiconductor device 100B according to the second comparative example. That is, the transistor MN0 among the N-type transistors MN0 to MN2 connected in series between the output terminal 13 and the ground line GL is arranged close to an output terminal 13 side and has a drain electrically connected to the output terminal 13. The respective withstand voltages of the transistors MN0 to MN2 and MP0 to MP2 are also the same as that explained with reference to FIG. 4.

Similarly, the transistor MP0 among the P-type transistors MP0 to MP2 connected in series between the output terminal 13 and the power supply line PL is arranged close to the output terminal 13 side and has a drain electrically connected to the output terminal 13.

The output voltage of the level shift circuit 20 similar to that in FIG. 1 is inputted to the gate of the transistor MP2 as a gate voltage signal VPG2. Therefore, VCCQH (3.3 [V]) is inputted to the gate of the transistor MP2 when the input signal VIN is at an L level (GND=0 [V]), and (1/2) VCCQH (1.65 [V]) is inputted to the gate of the transistor MP2 when the input signal VIN is at a H level (VCCQ=1.8 [V]).

The output signal (VINV) of the inverter 15 similar to that in FIG. 1 is inputted to the gate of the transistor MN2 as a gate voltage signal VGN0. That is, the low power supply potential VCCQ is inputted to the gate of the transistor MN2 when the input signal VIN is at the L level, and the ground potential GND is inputted to the gate of the transistor MN2 when the input signal VIN is at the H level. Thus, a signal for complimentarily turning on or off the transistors MN2 and MP2 according to the input signal VIN is inputted to each gate of the transistors MN2 and MP2.

In FIG. 5, the transistor MP0 corresponds to one example of a "first P-type transistor", the transistor MP2 corresponds to an example of a "second P-type transistor", and the transistor MP1 corresponds to an example of a "third P-type transistor". Similarly, the transistor MN0 corresponds to an example of a "first N-type transistor", the transistor MN2 corresponds to an example of a "second N-type transistor", and the transistor MN1 corresponds to an example of a "third N-type transistor". Alternatively, the ground potential GND corresponds to an example of a "reference potential", the high power supply potential VCCQH corresponds to an example of a "first power supply potential", the low power supply potential VCCQ corresponds to an example of a "second power supply potential", and the ground line GL corresponds to an example of a "reference potential line".

In the semiconductor device 101A as well, when the input signal VIN is at the H level (VCCQ=1.8 [V]), the transistors MP0 to MP2 are turned on and the output terminal 13 is thereby electrically connected to the power supply terminal 11 and is set to VOUT=VCCQH (3.3 [V]). meanwhile, when the input signal VIN is at the L level (GND=0 [V]), the transistors MN0 to MN2 are turned on and the output terminal 13 is thereby electrically connected to the ground terminal 12 and is set to the output voltage VOUT=GND (0 [V]).

A bias voltage VREFP for turning on the transistor MP1 is inputted to the gate of the transistor MP1, and a bias voltage VREFN for turning on the transistor MN1 is inputted to the gate of the transistor MN1. For example, the bias voltages VREFP, VREFN are set correspondingly to an intermediate potential between the high power supply potential VCCQH and the ground potential GND. For example, the bias voltages VREFP, VREFN can be generated by an intermediate potential generation circuit 120 shown in FIG. 6. The bias voltage VREFP and the bias voltage VREFN correspond to examples of a "first bias voltage" and a "second bias voltage", respectively.

Figure 6:
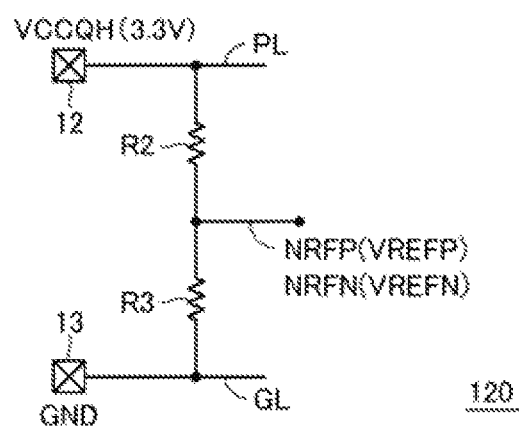
FIG. 6 is a circuit diagram for explaining a configuration example of an intermediate potential generation circuit.

With reference to FIG. 6, the intermediate potential generation circuit 120 has resistance elements R2, R3 connected in series via an intermediate potential nodes NRFP, NRFN between the power supply line PL and the ground line GL. As a result, intermediate potentials obtained by dividing the high power supply potential VCCQH by the resistance elements R2 and R3 are generated at the intermediate potential nodes NRFP, NRFN.

A potential of the intermediate potential node NRFP is inputted to the gate of the transistor MP1 and the gate voltage control circuit 110 as a bias voltage VREFP. Similarly, a potential of the intermediate potential node NRFN is inputted to the gate of the transistor MN1 and the gate voltage control circuit 110 as a bias voltage VREFN. Therefore, 0<VREFN, VREFP<VCCQH (3.3 [V]), and VREFN, VREFP are determined by a voltage division ratio of the resistance elements R2, R3.

Incidentally, the bias voltages VREFN, VREFP may be set to the same potential by the common intermediate potential generation circuit 120, or may be set to different potentials by the individual intermediate potential generation circuits 120 having different voltage division ratios.

With reference to FIG. 5 again, the gate voltage control circuit 110 has N-type transistors MN11, MN12 and P-type transistors MP11, MP12. The gate voltage control circuit 110 controls the gate voltage signal VPG0 of the transistor MP0 and the gate voltage signal VNG0 of the transistor MN0 according to the output voltage VOUT of the output terminal 13.

Sources of the transistors MN11 and MN12 are electrically connected to the node NPG0 that transmits the gate voltage signal VPG0 to the transistor MP0. A drain of transistor MN11 is electrically connected to the output terminal 13 via the resistance element R1, and a drain of transistor MN12 is electrically connected to an intermediate potential node NRFP of the intermediate potential generation circuit 120.

The bias voltage VREFP from the intermediate potential generation circuit 120 is inputted to a gate of the transistor MN11, and a gate of the transistor MN12 is electrically connected to the output terminal 13 via the resistance element R1. The transistor MN11 corresponds to an example of a "fourth N-type transistor", and the transistor MN12 corresponds to an example of a "fifth N-type transistor".

The sources of the transistors MP11 and MP12 are electrically connected to the node NNG0 that transmits the gate voltage signal VNG0 to the transistor MN0. The drain of the transistor MP11 is electrically connected to the output terminal 13 via the resistance element R1, and the drain of the transistor MP12 is electrically connected to the intermediate potential node NRFN of the intermediate potential generation circuit 120.

The bias voltage VREFN from the intermediate potential generation circuit 120 is inputted to the gate of the transistor MP11, and the gate of the transistor MP12 is electrically connected to the output terminal 13 via the resistance element R1. That is, the transistor MP11 corresponds to an example of a "fourth P-type transistor" and the transistor MP12 corresponds to an example of a "fifth P-type transistor".

Consequently, the gate voltage signal VNG0 of the transistor MN0 is controlled according to a level relationship between the output voltage VOUT of the output terminal 13 and the bias voltage VREFN depending on whether the transistors MP11, MP12 are turned on or off. Specifically, when VOUT<VREFN, the transistor MP12 is turned on and the gate voltage signal VNG0 is thereby set to the bias voltage VREFN. Meanwhile, when VOUT>VREFN, the transistor MP11 is turned on and the gate voltage signal VNG0 is set so as to change following the output voltage VOUT.

Similarly, the gate voltage signal VPG0 of the transistor MP0 is controlled according to a level relationship between the output voltage VOUT of the output terminal 13 and the bias voltage VREFP depending on whether the transistors MN11, MN12 are turned on or off. Specifically, when VOUT>VREFP, the transistor MN12 is turned on and the gate voltage signal VPG0 is thereby fixed to the bias voltage VREFP. Meanwhile, when VOUT<VREFP, the transistor MN11 is turned on and the gate voltage signal VPG0 is thereby set to change following the output voltage VOUT.

In this manner, the gate voltage control circuit 110 maintains the transistor MP0 or MN0 on an on-state and, in a transient state in which the output voltage VOUT changes between GND and VCCQH, at least one of the gate voltage signals VNG0 and VPG0 operates so as to change following the output voltage VOUT.

Next, in the semiconductor device 101A, described will be a transient operation in which a state of the output voltage VOUT=VCCQH (H level) is changed to VOUT=GND (L level) by turning on the transistors MN0 to MN2.

In this transient operation, the gate voltage signal VNG0 of the transistor MN0 follows the output voltage VOUT and drops after starting from a voltage (VOUT=VCCQH) higher than the bias voltage VREFN. Similarly to the second case described in the semiconductor device 100B according to the second comparative example, this makes it possible to suppress the drain-source voltage Vds0$n$ of the transistor MN0 that is generated depending on turning-on of the transistors MN2, MN1.

When VOUT<VREFN in a process in which the output voltage VOUT further drops depending on the turn-on of the transistors MN0 to MN2, the gate voltage signal VNG0 is set similarly to the bias voltage VREFN. Therefore, by setting the bias voltage VREFN to be equal to or lower than the withstand voltage of the transistor MN0, the transistor MN0 can prevent the overvoltage from being applied to the drain-gate voltage as in the first case described in the semiconductor device 100B according to the second comparative example while maintaining the on-state.

Next, in the semiconductor device 101A, described will be a transient operation in which a state of the output voltage VOUT=GND (L level) changes to VOUT=VCCQH (H level) by of 33 turning on the transistors MP0 to MP2.

In this transient operation, the gate voltage signal VPG0 of the transistor MP0 follows the output voltage VOUT and rises after starting from a voltage (VOUT=GND) lower than the bias voltage VREFP. This makes it possible to suppress the drain-source voltage Vds0$p$ of the transistor MP0 that is generated depending on the turn-on of the transistors MP2, MP1.

When VOUT>VREFP in a process in which the output voltage VOUT further rises depending on the turn-on of the transistors MP0 to MP2, the gate voltage signal VNG0 is fixed to the bias voltage VREFP. Therefore, by setting the bias voltage VREFP to the withstand voltage of the transistor MP0 or less, the transistor MN0 does not apply the overvoltage to the drain-gain voltage while maintaining the on-state.

As described above, the transistors MN0, NP0, whose drains are electrically connected to the output terminal 13 due to the arrangement of the gate voltage control circuit 110, can control the gate voltage so as to suppress the hot carrier deterioration without exceeding the withstand voltage at phases in which both advantages of the first and second cases in the semiconductor device 100B according to the second comparative example are enjoyed.

In the semiconductor device 101A according to the first embodiment, the gate voltage signals VPG2, VNG2 of the transistors MN2, MP2 are generated without arranging the potential conversion circuits 21, 22 in the semiconductor device 100A according to the first comparative example. That is, by suppressing the gate-source voltages of the transistors MN2, MP2 at the time of the turn-on, it is possible to suppress the hot carrier deterioration without lowering the operation speed along with the suppression of the gate-source voltage.

Figure 7A:
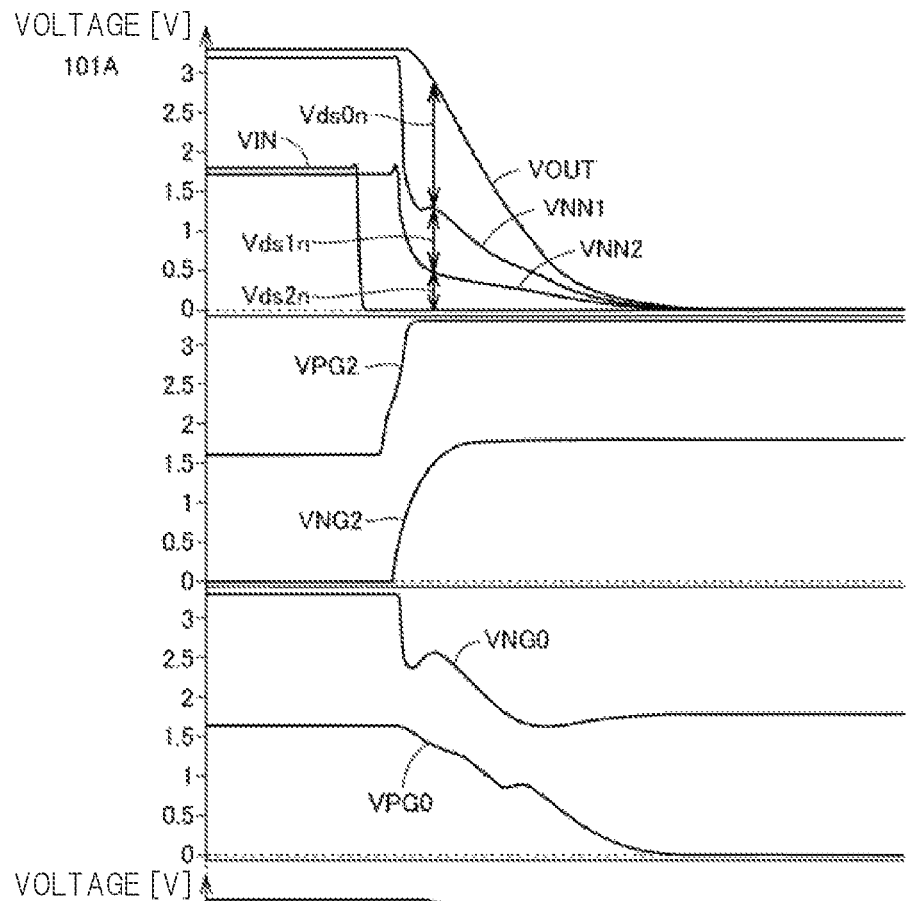
FIG. 7A is a transient operation waveform diagram of the semiconductor device according to the first embodiment.
Figure 7B:
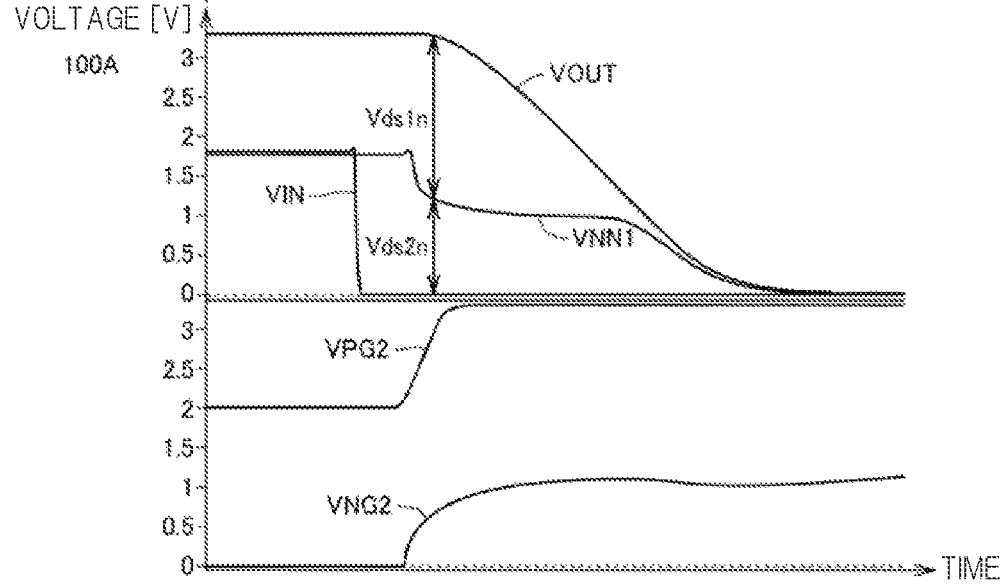
FIG. 7B is a transient operation waveform diagram of the semiconductor device according to a comparative example.

FIG. 7A shows a transient operation waveform diagram of the semiconductor device 101A shown in FIG. 5, specifically, a transient operation waveform diagram when the input signal VIN changes from a H level to an L level. Incidentally, FIG. 7A shows transient operation waveforms of the semiconductor device 101A, while FIG. 7B shows transient operation waveforms of the semiconductor device 100A (first comparative example). FIG. 7B shows the waveform diagram of FIG. 2 again on the same time axis as that of FIG. 7A.

As shown in FIG. 7A, the gate voltage signal VPG2 rises faster than that in FIG. 2 from 1.8 [V] (L level: (1/2)·VCCQH) to 3.3 [V] (H level: VCCQH). Similarly, the gate voltage signal VNG2 rises faster than that in FIG. 7B from 0 [V] (L level: GND) to 1.8 [V] (H level: VCCQ). Therefore, it can be understood that, in FIG. 7A, a turn-on operation of the transistor MN2 is faster and a change speed of the output voltage VOUT is also higher than those in FIG. 7B.

Further, in FIG. 7A, when the gate voltage signal VNG2 rises, the gate voltage signal VNG0 follows the output voltage VOUT and is set so as to be higher than VREFN (1.8 [V]) by the gate voltage control circuit 110. As a result, by reducing on-resistance of the transistor MN0, an amount of decrease in the potential (VNN1) of the node NN1 is suppressed, and the transient drain-source voltage Vds0$n$ of the transistor MN0 can be reduced so as to be equal to or less than Vds1$n$ in FIG. 7B. This makes it possible to suppress the hot carrier deterioration similarly to the first comparative example.

As described above, according to the semiconductor device 101A according to the first embodiment, in generating an output voltage having a voltage amplitude (here, 3.3 [V]) higher than the withstand voltage (here, 1.8 [V]) of the transistor, the hot carrier deterioration can be suppressed like the first comparative example (semiconductor device 100A) without lowering the operation speed like the first comparative example (semiconductor device 100A).

Second Embodiment

Figure 8:
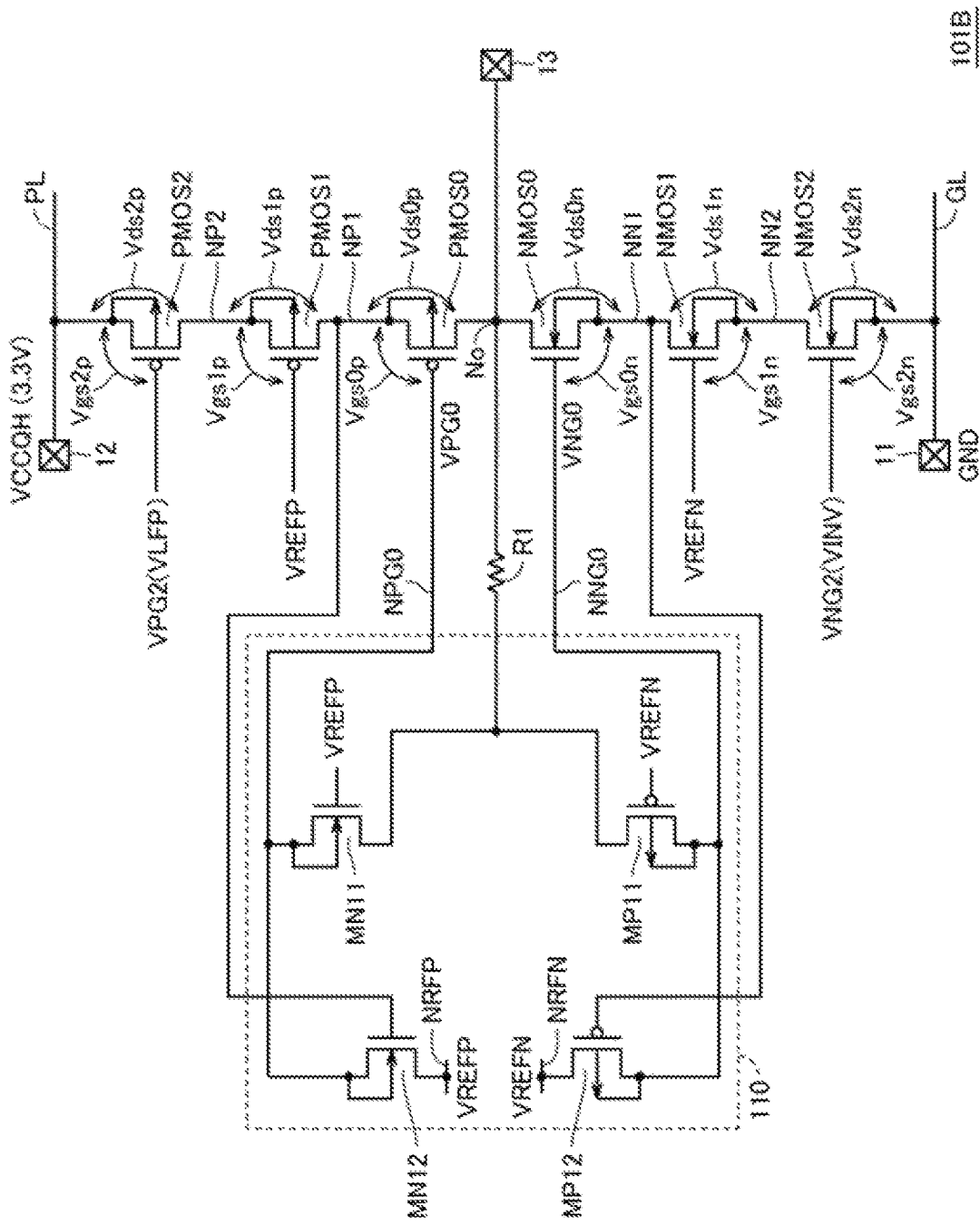
FIG. 8 is a circuit diagram for explaining a configuration of a semiconductor device according to a second embodiment.

FIG. 8 is a circuit diagram for explaining a configuration of a semiconductor device 101B according to a second embodiment.

With reference to FIGS. 8 and 5, a semiconductor device 101B differs from the semiconductor device 100A (FIG. 5) according to the first embodiment in that gates of the transistors MN12 and MP12 in gate voltage control circuit 110 are connected to different connection destinations. Specifically, the gate of the transistor MN12 is electrically connected not to the output terminal 13 but to the node NP1 corresponding to the source of the transistor MP0. Similarly, the gate of transistor MP12 is electrically connected not to the output terminal 13 but to the node NN1 corresponding to the source of the transistor MN0. Other configurations of the semiconductor device 101B are similar to those of the semiconductor device 101A, so that a detailed description thereof will not be repeated.

In the semiconductor device 101B, the potential of the node NP1 close to the ground terminal 12 decreases earlier than the potential of the output terminal 13 during the transient operation in which the output voltage VOUT changes from the H level to the L level in accordance with the turn-on of the transistors MN0 to MN2. This makes it possible to turn on the transistor MP12 earlier than turning on the transistor MP11 in the gate voltage control circuit 110.

Similarly, the potential of the node NP1 close to the power supply terminal 11 rises earlier than the potential of the output terminal 13 during the transient operation in which the output voltage VOUT changes from the L level to the H level in accordance with the turn-on of the transistors MN0 to MN2. This makes it possible to turn on the transistor MN12 earlier than turning off the transistor MN11 in the gate voltage control circuit 110.

In contrast, in the semiconductor device 101A shown in FIG. 5, the gates of the transistors MN12, MP12 are electrically connected to the output terminal 13. Consequently, both the transistors MP11, MP12 or both the transistors MN11, MN12 may be turned off while the output voltage VOUT is transiently equal to the bias voltages VREFN, VREFP. Specifically, during a period in which a voltage difference between the bias voltage VREFN or VREFP and the output voltage VOUT is smaller than the threshold voltages of the transistors MN11, MN12 or the threshold voltages of the transistors MP11, MP12, both the transistors MP11, MP12 or both the transistors MN11, MN12 are turned off.

Thus, when both the transistors MP11, MP12 or both the transistors MN11, MN12 are turned off, it is concerned that the gate voltage signals VNG0, VPG0 may become transiently unstable due to the floating of the node NNG0 or NPG0. For example, during a period when the node NNG0 or NPG0 is floating, the gate voltage signals VNG0, VPG0 are influenced by the voltage change of the output terminal 13 via capacitive coupling, so that it is concerned that ON-currents of the transistors MN0, MP0 decrease. In particular, under a high-speed operation, there is a risk that the operation speed of the semiconductor device 101A will be destabilized due to the decrease in the ON-current.

In the semiconductor device 101B according to the second embodiment, the gate voltage signals VNG0, VPG0 can be stabilized by changing gate connection destinations of the transistors MN12, MP12 in the gate voltage control circuit 110 from those in the first embodiment. This makes it possible to stably operate the semiconductor device 101B even under the high-speed operation.

Third Embodiment

In a third embodiment, the semiconductor device according to the first or second embodiment will be described about a configuration for enabling to switch between a low voltage operation mode in which the amplitude of the output signal is equivalent to the low power supply potential VCCQ and a high voltage operation mode in which the amplitude of the output signal is equivalent to the high power supply potential VCCQH.

Figure 9:
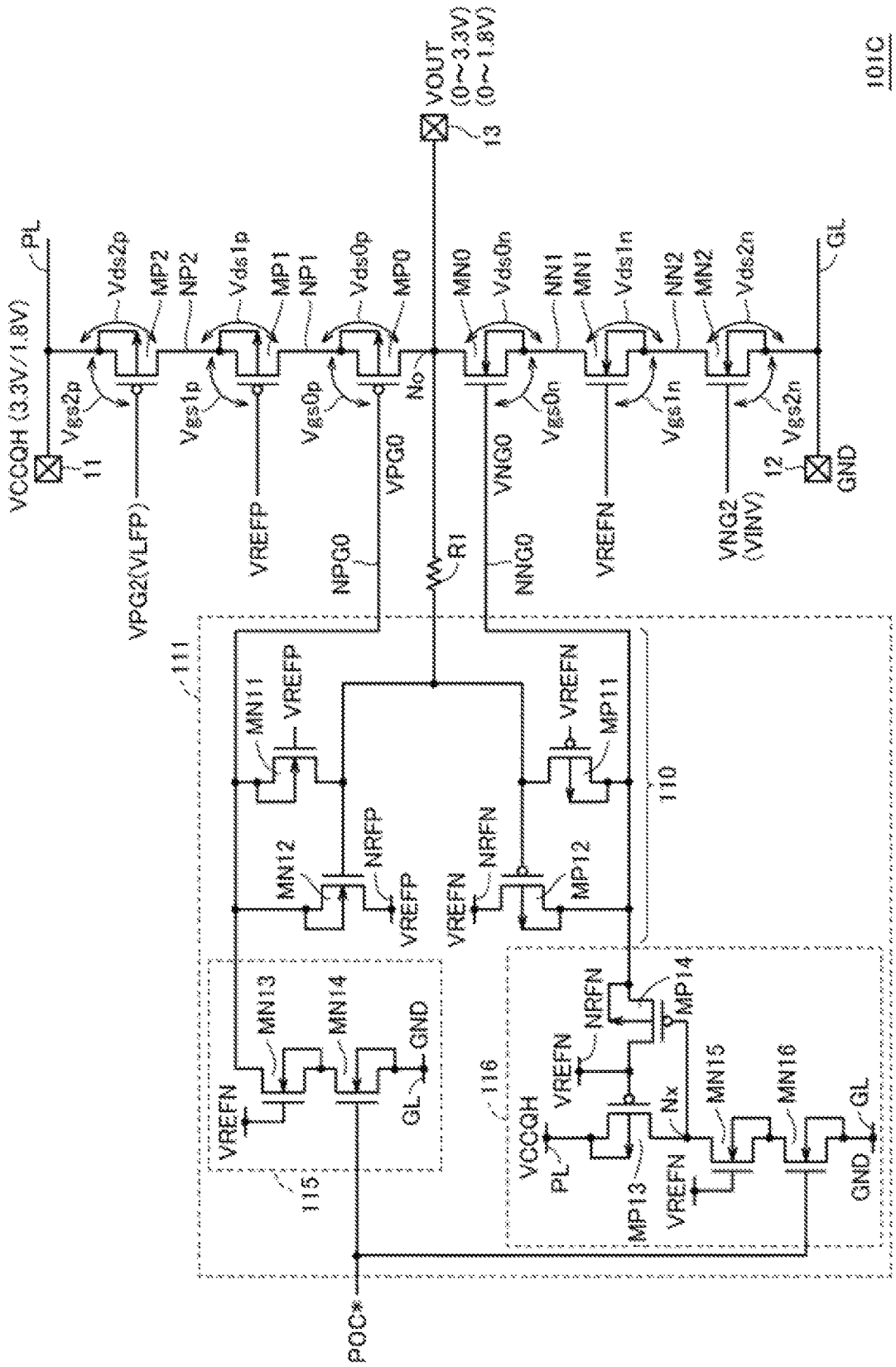
FIG. 9 is a circuit diagram for explaining a configuration of a semiconductor device according to a third embodiment.

FIG. 9 is a circuit diagram for explaining a configuration of a semiconductor device 101C according to a third embodiment. According to a power mode signal POC*, a semiconductor device 101C is configured to be operable by selecting a high voltage operation mode of having VCCQH=3.3[V] supplied to the power supply terminal 11 and the power supply line PL, and a low voltage operation mode of having VCCQH=1.8[V]. Here, the power supply mode signal POC* is set to an L level in the high voltage operation mode, and is set to a H level in the low voltage operation mode. The high voltage operation mode corresponds to one example of a "first operation mode" and the low voltage operation mode corresponds to one example of a "second operation mode", respectively.

With reference to FIGS. 9 and 5, the semiconductor device 101C is different from the semiconductor device 100A (FIG. 5) according to the first embodiment in that it includes a gate voltage control circuit 111 instead of the gate voltage control circuit 110. The gat voltage control circuit 111 further includes connection selection circuits 115, 116 in addition to the configuration of the gate voltage control circuit 110 shown in FIG. 8. Other configurations of the semiconductor device 101C are similar to those of the semiconductor device 101A, and a detailed description thereof will not be repeated.

The connection selection circuit 115 has N-type transistors MN13 and NM14. The transistors MN13 and MN14 are connected in series between a node NPG0 (gate of transistor MP0) and a ground line GL. A bias voltage VREFN is inputted to the gate of the transistor MN13, and a power mode signal POC* is inputted to the gate of the transistor MN14. The connection selection circuit 115 corresponds to a "first connection selection circuit" provided for the gate of the transistor MP0.

The connection selection circuit 116 has N-type transistors MN15, MN16, and P-type transistors MP13, MP14. Transistor MP14 is connected between a node NNG0 (gate of transistor MN0) and an intermediate potential node NRFN. The gate of the transistor MP14 is connected to a node Nx. The transistor MP13 is connected between the power supply line PL and the node Nx. A bias voltage VREFN is inputted to the gate of the transistor MP13.

The transistors MN15 and MN16 are connected in series between the node Nx and the ground line GL. The bias voltage VREFN is inputted to the gate of the transistor MN15. The power mode signal POC* is inputted to the gate of the transistor MN16. The connection selection circuit 116 corresponds to a "second connection selection circuit" provided for the gate of the transistor MN0.

In the low voltage operation mode, the power supply mode signal POC* is set to a H level, VCCQH=1.8 [V], and the bias voltages VREFN, VREFP are set to about 0.8 [V] to 1.0 [V].

By turning on the transistor MN14 in accordance with POC*=H, the source of the transistor MN13, whose gate receives the bias voltage VREFN, becomes the ground potential GND, so that the transistor MN13 is also turned on. The connection selection circuit 115 electrically connects the node NPG0, which transmits the gate voltage signal VPG0, to the ground line GL by turning on the transistors MN13 and MN14.

Similarly, in the low voltage operation mode, the transistor MN15, whose gate receives the bias voltage VREFN, is also turned on in conjunction with the turn-on of the transistor MN16, whose gate receives the power mode signal POC*. In accordance with the turn-on of the transistors MN15, MN16, the node Nx becomes the ground potential GND, so that the transistor MP13, whose gate receives the bias voltage VREFN, is turned off while the transistor MP14 having the gate connected to the node Nx is turned on. Thus, the connection selection circuit 116 electrically connects the node NNG0, which transmits the gate voltage signal VNG0, to the intermediate potential node NRFN supplying the bias voltage VREFN.

As a result, in the low voltage operation mode (POC*=H level), the gate voltage control circuit 111 fixes the gate voltage signal VPG0 to the ground potential GND without depending on the operation of the gate voltage control circuit 110, that is, regardless of the output voltage VOUT and, simultaneously, fixes the gate voltage signal VNG0 to the bias voltage VREFN.

Therefore, in the low voltage operation mode, the transistors MN0 and MP0 are kept the on-states regardless of the output voltage VOUT in the semiconductor device 101C. Alternatively, in the low voltage operation mode, a voltage conversion function of the level shift circuit 20 is stopped, and a signal equivalent to the inverter output signal VINV (0 to 1.8 [V]) from the inverter 15 is inputted also to the gate of the transistor MP2. As a result, the semiconductor device 101C operates so as to output the output voltage VOUT, which depends on the input signal VIN (0 to 1.8 [V]), to an amplitude of 0 [V] (GND) to 1.8 [V] (VCCQH).

In contrast, in the high voltage operation mode in which the power mode signal POC* is set to an L level, the additionally arranged transistors MN13 to MN16 in the gate voltage control circuit 111 are turned off. Further, when VCCQH=3.3 [V] and VREFN=1.8 [V], the high power supply potential VCCQH (3.3 [V]) is transmitted to the node Nx since the transistor MP13 is turned on. This keeps the transistor MP14 an off-state.

As a result, the connection selection circuit 115 electrically disconnects the node NPG0 from the ground line GL. Similarly, the connection selection circuit 116 electrically disconnects the node NNG0 from the intermediate potential node NRFN. Therefore, in the high voltage operation mode (POC*=L level), the gate voltage control circuit 111 controls the potentials of the gate voltage signals VNG0, VPG0 by the same gate voltage control circuit 110 as in FIG. 5. That is, the gate voltage signals VNG0, VPG0 are controlled in the same manner as in the first embodiment. As a result, the semiconductor device 101C operates in the same manner as the semiconductor device 101A, and outputs the output voltage VOUT depending on the input signal VIN (0 to 1.8 [V]) to an amplitude of 0 [V] (GND) to 3.3 [V] (VCCQH).

As described above, in the semiconductor device 101A according to the first embodiment, when the difference between the output voltage VOUT and the bias voltages VREFN, VREFP is smaller than the threshold voltage of the transistor, a period of time in which both the transistor MN11 and MN12 are turned off or a period of time in which both the transistors MP11 and MP12 are turned off in the gate voltage control circuit 110 is generated. Consequently, it is concerned that the potentials of the gate voltage signals VNG0, VPG0 may become unstable. Therefore, when the semiconductor device 101A is operated in the low voltage operation mode (VCCQH=1.8 [V]), it is concerned that a ratio of a period of time, during which the potentials of the above-described gate voltage signals VNG0, VPG0 become unstable, to the entire period of time on a transient state in which the output voltage VOUT changes between GND (0 [V]) and VCCQH (1.8 [V]) is increased.

In contrast, according to the semiconductor device 101C according to the third embodiment, in the low voltage operation mode, the gate voltage signals VNG0 and VPG0 can be controlled so as to fix the transistors MN0, MP0 to the on-states. As a result, the operation can be prevented from becoming unstable due to a change in ON-currents of the transistors MN0, MP0 in the low voltage operation mode.

Alternatively, in the semiconductor device 101C according to the third embodiment, it is also possible to change the connection destinations of the gates of the transistors MN12 and MP12, which are included in the gate voltage control circuit 110, to the nodes NN1 and NP1, respectively, as in FIG. 7A. That is, combining the semiconductor device 101B (FIG. 8) according to the second embodiment and the semiconductor device according to the third embodiment makes it possible to operate the semiconductor device 101C in the same manner as the semiconductor device 101B in the high voltage operation mode.

Alternatively, in the first to third embodiments, it is possible to replace the arrangement of the transistors MN1 and MN2 to arrange the transistor MN2 on the ground terminal 12 side. Similarly, it is also possible to replace the arrangement of the transistors MP1 and MP2 to arrange the transistor MP2 on the power supply terminal 11 side.

Incidentally, in the first to third embodiments, assumed has been an example in which transistors with a withstand voltage of 1.8 [V] are connected in series and an amplitude of the output voltage VOUT is set to 3.3 [V]. Consequently, a configuration example in which three transistors are connected in series between the power supply line PL and the ground line GL and the output node No (output terminal 13) has been described. However, the number of transistors forming the output stage and connected in series is not limited to the examples given so far. Such a point is confirmedly described.

In the first to third embodiments, the configuration example in which: MN2 and MP2 (first transistors) whose gates of 33 a voltage corresponding to the input signal VIN is inputted to; MN0 and MP0 (second transistors) whose gate voltages are controlled by the gate voltage control circuits 110 and 111; and MN1 and MP1 (third transistors) whose gates the bias voltages VREFP and VREFN are inputted to are arranged one by one have been described. However, in order to secure the withstand voltage between the drain and the source, the arbitrary number of transistors of the same conductivity type are provided can be additionally arranged between the transistors MN2, MP2 and the transistors MN1, MP1 and/or between the transistors MN0, MP0 and the transistors MN1, MP1. At this time, the gate voltage of the additionally arranged transistors can be controlled similarly to any of the transistors MN2, MP2 (first transistor), the transistors MN0, MP0 (second transistor), or the transistors MN1, MP1 (third transistor).

Alternatively, it is also possible to configure the semiconductor device according to the present embodiment by omitting the placement of the transistors MN1 and MP1 whose gates the bias voltages VREFP and VREFN are inputted to.

Figure 10:
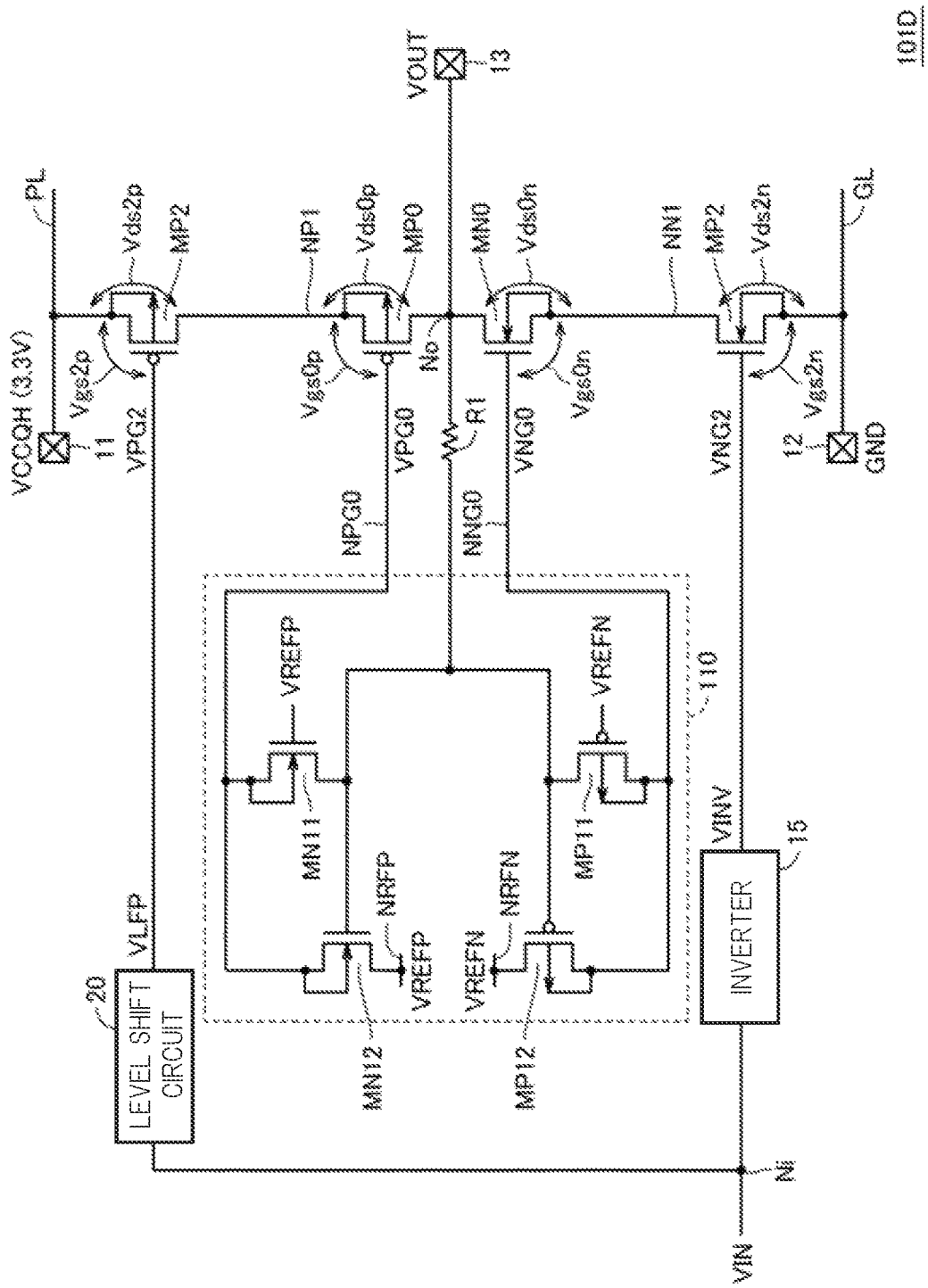
FIG. 10 is a circuit diagram for explaining a configuration of a modification example of the semiconductor device according to the present embodiment.

FIG. 10 shows a circuit diagram for explaining a configuration of a modification example of the semiconductor device according to the present embodiment.

With reference to FIGS. 10 and 5, a semiconductor device 101D according to a modification example differs from the semiconductor device 100A (FIG. 5) according to the first embodiment in that the arrangement of the transistor MN1 whose gate the bias voltage VREFP is inputted to and the transistor MP1 whose gate the bias voltage VREFP is inputted to is omitted. Therefore, the output stage is configured by the P-type transistors MP0 and MP2 connected in series between the power supply line PL and the output node No via the node NP1, and the N-type transistors MN0 and MN2 connected in series between the ground line GL and the output node No via the node NN1.

The gate voltages of the transistors MN2 and MP2 are controlled to complementarily turn on and off the transistors MN2 and MP2 according to the input signal VIN, as in the first embodiment. Gate voltage signals VNG0 and VPG0 generated by the gate voltage control circuit 110 similar to that in FIG. 5 or 8 are inputted to the gates of the transistors MN0 and MP0.

Alternatively, the gate voltage signals VNG0 and VPG0 generated by the gate voltage control circuit 111 shown in FIG. 9 may be inputted to the gates of the transistors MN0 and MP0.

Alternatively, in the semiconductor device 101D of FIG. 10, the arbitrary number of transistors of the same conductivity type can be additionally arranged between the transistors MN0, MP0 (first transistor) and the transistors MP2, MN2 (second transistor). At this time, the gate voltages of the additionally arranged transistors can be controlled in the same manner as any of the transistors MN2, MP2 (first transistors) or the transistors MN0, MP0 (second transistors).

Regarding two or more than embodiments described above, including combinations not mentioned in the specification, appropriately combining the configurations described in each embodiment within a range that does not cause inconsistency or contradiction has been designed from the beginning of the application. This point is also confirmedly described.

Although the present disclosure has been specifically described above based on the embodiments, it is not limited to the embodiments and, needless to say, the present disclosure can be variously modified within a range not departing from the scope thereof.

What is claimed is:

1. A semiconductor device generating an output signal at an output terminal, the output signal having a larger voltage amplitude than an input signal, the semiconductor device comprising:
    first and second P-type transistors connected in series between a power supply line supplying a first power supply potential and the output terminal; and
    first and second N-type transistors connected in series between a reference potential line supplying a reference potential and the output terminal,
    wherein the first N-type and P-type transistors have drains electrically connected to the output terminal,
    wherein signals for complementarily turning on and off the second N-type and P-type transistors are inputted to gates of the second N-type and P-type transistors according to the input signal, respectively,
    wherein the semiconductor device further includes a gate voltage control circuit for changing gate voltages of the first P-type and N-type transistors in accordance with a voltage of the output terminal,
    wherein the gate voltage control circuit is configured to cause the first P-type or N-type transistor to follow a change in a voltage of the output terminal while keeping the first P-type or N-type transistor on-states when a voltage of the output signal changes in accordance with a change in a logic level of the input signal, and configured to change a gate voltage of at least one of one of the first N-type and P-type transistors,
    wherein the gate voltage control circuit is configured so that when the voltage of the output terminal is higher than a predetermined first bias voltage, the first bias voltage is inputted to the gate of the first P-type transistor and when the voltage of the output terminal is lower than the first bias voltage, a voltage following the voltage of the output terminal is inputted to the gate of the first P-type transistor, and
    wherein the first bias voltage is equal to or less than a withstand voltage of each of the first and second P-type transistors and the first and second P-type transistors.

2. The semiconductor device according to claim 1, further comprising a third P-type transistor connected in series with the second P-type transistor between the first P-type transistor and the power supply line,
    wherein the first bias voltage is inputted to a gate of the third P-type transistor.

3. The semiconductor device according to claim 1,
    wherein the gate voltage control circuit is configured so that when the voltage of the output terminal is lower than a predetermined second bias voltage, the second bias voltage is inputted to the gate of the first N-type transistor and when the voltage of the output terminal is higher than the second bias voltage, a voltage following the voltage of the output terminal is inputted to the gate of the first N-type transistor, and wherein the second bias voltage is equal to or lower than a withstand voltage of each of the first and second P-type transistors and the first and second P-type transistors.

4. The semiconductor device according to claim 3, further comprising a third N-type transistor connected in series with the second N-type transistor between the first N-type transistor and the reference potential line, and wherein the second bias voltage is inputted to a gate of the third N-type transistor.

5. The semiconductor device according to claim 1, wherein the gate voltage control circuit includes:
  a fourth N-type transistor having a source connected to the gate of the first P-type transistor and a drain electrically connected to the output terminal; and
  a fifth N-type transistor having a source connected to the gate of the first P-type transistor and a drain electrically connected to a node supplying the first bias voltage,
wherein the first bias voltage is inputted to a gate of the fourth N-type transistor, and
wherein a gate of the fifth N-type transistor is electrically connected to the output terminal.

6. The semiconductor device according to claim 5, wherein the semiconductor device operates by selectively applying a first operation mode in which the first power supply potential is set to a first potential and a second operation mode in which the first power supply potential is set to a second potential lower than the first potential, and wherein the gate voltage control circuit further includes a first connection selection circuit, the first connection selection circuit being configured to electrically connect the gate of the first P-type transistor to the reference potential line in the second operation mode and electrically disconnect the gate of the first P-type transistor from the reference potential line in the first operation mode.

7. The semiconductor device according to claim 1, wherein the gate voltage control circuit includes:
  a fourth N-type transistor having a source connected to the gate of the first P-type transistor and a drain electrically connected to the output terminal; and
  a fifth N-type transistor having a source connected to the gate of the first P-type transistor and a drain electrically connected to a node supplying the first bias voltage,
wherein the first bias voltage is inputted to a gate of the fourth N-type transistor, and
wherein a gate of the fifth N-type transistor is electrically connected to the source of the first P-type transistor.

8. The semiconductor device according to claim 3, wherein the gate voltage control circuit includes:
  a fourth P-type transistor having a source connected to the gate of the first N-type transistor and a drain electrically connected to the output terminal; and
  a fifth P-type transistor having a source connected to the gate of the first N-type transistor and a drain electrically connected to a node supplying the second bias voltage,
wherein the second bias voltage is inputted to the gate of the fourth P-type transistor, and
wherein the gate of the fifth P-type transistor is electrically connected to the output terminal.

9. The semiconductor device according to claim 8, wherein the semiconductor device operates by selectively applying a first operation mode in which the first power supply potential is set to a first potential and a second operation mode in which the first power supply potential is set to a second potential lower than the first potential, and wherein the gate voltage control circuit further includes a second connection selection circuit, the second connection selection circuit being configured to electrically connect the gate of the first N-type transistor to a node supplying the second bias voltage in the second operation mode and to electrically disconnect the gate of the first N-type transistor from the node in the first operation mode.

10. The semiconductor device according to claim 3, wherein the gate voltage control circuit includes:
  a fourth P-type transistor having a source connected to the gate of the first N-type transistor and a drain electrically connected to the output terminal; and
  a fifth P-type transistor having a source connected to the gate of the first N-type transistor and a drain electrically connected to a node supplying the second bias voltage,
wherein the second bias voltage is inputted to the gate of the fourth P-type transistor, and
wherein the gate of the fifth P-type transistor is electrically connected to the output terminal, which is electrically connected to the source of the first N-type transistor.

11. The semiconductor device according to claim 1, wherein the semiconductor device operates by selectively applying a first operation mode in which the first power supply potential is set to a first potential and a second operation mode in which the first power supply potential is set to a second potential lower than the first potential, and wherein when the voltage of the output signal changes in accordance with a change in a logic level of the input signal, the gate voltage control circuit is configured to operate to: be caused to follow a change in the voltage of the output terminal and change at least one of the gate voltage of the first N-type transistor and the gate voltage of the first P-type transistor in the first operation mode; and fix the gate voltage of the first N-type transistor and the gate voltage of the first P-type transistor regardless of the voltage of the output terminal in the second operation mode.

12. The semiconductor device according to claim 1, further includes:
  a third P-type transistor connected in series with the second P-type transistor between the first P-type transistor and the power supply line; and
  a third N-type transistor connected in series with the second N-type transistor between the first N-type transistor and the reference potential line, and
wherein a bias voltage is inputted to the gates of the first P-type transistor and the third N-type transistor, the bias voltage being lower than a voltage difference between the reference potential for turning on the third P-type transistor and the third N-type transistor and the first power supply potential.

13. The semiconductor device according to claim 1, wherein the input signal is set to the reference potential or a second power supply potential lower than the first power supply potential, and wherein a withstand voltage of each of the first and second P-type transistors and the first and second N-type transistors is equal to or more than a potential difference between the second power supply potential and the reference potential.

* * * * *